United States Patent
An

(10) Patent No.: US 7,065,000 B2
(45) Date of Patent: Jun. 20, 2006

(54) SEMICONDUCTOR MEMORY DEVICE CAPABLE OF STABLY SETTING MODE REGISTER SET AND METHOD THEREFOR

(75) Inventor: Yong-Bok An, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 29 days.

(21) Appl. No.: 11/030,485

(22) Filed: Jan. 5, 2005

(65) Prior Publication Data

US 2006/0002225 A1    Jan. 5, 2006

(30) Foreign Application Priority Data

Jun. 30, 2004   (KR) .................. 10-2004-0049875

(51) Int. Cl.
*G11C 8/00* (2006.01)

(52) U.S. Cl. ............... 365/230.06; 365/233; 365/201

(58) Field of Classification Search ........... 365/230.06, 365/233, 201, 230.08
See application file for complete search history.

(56) References Cited

U.S. PATENT DOCUMENTS

| | | | | |
|---|---|---|---|---|
| 5,448,528 A | | 9/1995 | Nagai | |
| 5,699,302 A | * | 12/1997 | Shinozaki et al. | 365/189.05 |
| 5,905,690 A | * | 5/1999 | Sakurai et al. | 365/233 |
| 6,104,668 A | * | 8/2000 | Lee et al. | 365/233 |
| 6,175,531 B1 | | 1/2001 | Buck et al. | |
| 6,347,356 B1 | * | 2/2002 | Saho | 711/104 |
| 6,392,909 B1 | | 5/2002 | Jang et al. | |
| 6,693,832 B1 | * | 2/2004 | Ok | 365/200 |
| 2003/0053362 A1 | | 3/2003 | Kawaguchi et al. | |

FOREIGN PATENT DOCUMENTS

| | | |
|---|---|---|
| JP | 2000-036192 | 2/2000 |
| JP | 2004-079162 | 3/2004 |

* cited by examiner

*Primary Examiner*—Anh Phung
(74) *Attorney, Agent, or Firm*—Blakely Sokoloff Taylor & Zafman

(57) ABSTRACT

A semiconductor memory device having a mode register set (MRS) includes: a decoding unit for decoding a plurality of address signals included in the MRS and outputting a plurality of decoded signals; and an output unit for outputting a plurality of configuration signals and activating one of the plurality of configuration signals in response to the plurality of decoded signals, wherein the output unit keeps its previous output signals if more than one of the plurality of decoded signals are activated.

8 Claims, 4 Drawing Sheets

SEMICONDUCTOR MEMORY DEVICE CAPABLE OF STABLY SETTING MODE REGISTER SET AND METHOD THEREFOR

FIELD OF INVENTION

The present invention relates to a semiconductor memory device; and, more particularly, to a semiconductor memory device having a mode register set configuration circuit for stably setting a mode register set.

DESCRIPTION OF PRIOR ART

Generally, a double data rate synchronous dynamic random access memory (DDR SDRAM) includes a mode register set (MRS) or an extended mode register set (EMRS). The MRS or the EMRS stores data for controlling various operations of the DDR SDRAM. The data for controlling various operations of the DDR SDRAM are determined based on address signals of the DDR SDRAM.

FIG. 1 is a diagram showing the MRS according to DDR SDRAM specification introduced by an international electronics standardization organization, namely the Joint Electron Device Engineering Council (JEDEC).

As shown, the MRS is determined based on a first to a sixteenth addresses A0 to A15 and a first to a third bank addresses BA0 to BA2. For example, a delay locked loop (DLL) reset, a test mode (TM), a burst type (BT) and an active power down exit time (PD) are respectively determined based on the ninth address A8, the eighth address A7, the fourth address A3 and the thirteenth address A12. As above-mentioned, all of the DLL reset, the TM, the BT and the PD are determined based on a single-bit address.

However, as shown in FIG. 1, each of a write recovery for autoprecharge (WR), a column address strobe (CAS) latency and a burst length (BL) is determined based on more than two addresses. For example, the WR is determined based on the tenth to the twelfth addresses A9 to A11. Therefore, a configuration circuit for decoding addresses is required so that the WR, the CAS latency or the BL is determined.

FIG. 2 is a schematic circuit diagram showing a first conventional MRS configuration circuit.

As shown, the first conventional MRS configuration circuit includes a plurality of NAND gates and inverters. The first conventional MRS configuration circuit receives and decodes the first to the third addresses A0 to A2 in order to determine the BL. If the first to the third addresses A0 to A2 are respectively 0, 1, and 0, the BL is set to 4. On the contrary, if the first to the third addresses A0 to A2 are respectively 1, 1 and 0, the BL is set to 8.

Since the BL is determined when the first to the third addresses A0 to A2 are respectively 0, 1 and 0 or 1, 1 and 0 as shown in FIG. 1, the first conventional MRS configuration circuit is designed for activating one of output signals of the first conventional MRS configuration circuit only when the first to the third addresses A0 to A2 are respectively 0, 1 and 0 or 1, 1 and 0.

Therefore, if the first to the third addresses A0 to A2 have other values, the first conventional MRS configuration circuit cannot determine the BL because none of the output signals of the first conventional MRS configuration circuit is activated. For example, if the first to the third addresses A0 to A2 are respectively 1, 0 and 0, all of the output signals of the first conventional MRS configuration circuit is inactivated as a logic low level.

FIG. 3 is a schematic circuit diagram showing a second conventional MRS configuration circuit.

As shown, the second conventional MRS configuration circuit includes a plurality of NAND gates and inverters. The second conventional MRS configuration circuit receives and decodes the fifth to the seventh addresses A4 to A6 in order to determine the CAS latency. The second conventional MRS configuration circuit generates a first to a fifth CAS latency signals CL<2> to CL<6> and activates one of the first to the fifth CAS latency signals CL<2> to CL<6> based on the fifth to the seventh addresses A4 to A6. For example, if the fifth to the seventh addresses A4 to A6 are respectively 1, 1 and 0, the second CAS latency signal CL<3> is activated as a logic high level, whereby the CAS latency is set to 3.

However, as shown in FIG. 1, when the fifth to the seventh addresses A4 to A7 become a reserved code, the CAS latency is not defined. Therefore, the second conventional MRS configuration circuit cannot determine the CAS latency if the fifth to the seventh addresses A4 to A7 become a reserved code. For example, if the fifth to the seventh addresses are respectively 0, 0 and 0, the CAS latency cannot be determined because none of the first to the fifth CAS latency signals CL<2> to CL<6> is activated.

FIG. 4 is a schematic circuit diagram showing a third conventional MRS configuration circuit.

As shown, the third conventional MRS configuration circuit includes a plurality of inverters and NAND gates. A structure of the third conventional MRS configuration circuit is similar to the second conventional MRS configuration circuit shown in FIG. 3.

The third conventional MRS configuration circuit receives and decodes the tenth to the twelfth addresses A9 to A11 in order to determine the WR. The third conventional MRS configuration circuit generates a first to a fifth write recovery signals tWR<2> to tWR<6> and activates one of the first to the fifth write recovery signals tWR<2> to tWR<6> based on the tenth to the twelfth addresses A9 to A11. For example, if the tenth to the twelfth addresses A9 to A11 are respectively 1, 0 and 1, the fourth write recovery signal tWR<5> is activated as a logic high level, whereby the WR is set to 5.

However, as shown in FIG. 1, when the tenth to the twelfth addresses A9 to A11 become a reserved code, the WR is not defined. Therefore, the third conventional MRS configuration circuit cannot determine the WR if the tenth to the twelfth addresses A9 to A11 become a reserved code. For example, if the tenth to the twelfth addresses are respectively 0, 0 and 0, the WR cannot be determined because none of the first to the fifth write recovery signals tWR<2> to tWR<6> is activated.

SUMMARY OF INVENTION

It is, therefore, an object of the present invention to provide a semiconductor memory device which is stably operated even if a reserved code is inputted to a mode register set (MRS).

In accordance with an aspect of the present invention, there is provided a semiconductor memory device having a mode register set (MRS) includes: a decoding unit for decoding a plurality of address signals included in the MRS and outputting a plurality of decoded signals; and an output unit for outputting a plurality of configuration signals and activating one of the plurality of configuration signals in response to the plurality of decoded signals, wherein the output unit keeps its previous output signals if more than one of the plurality of decoded signals are activated.

In accordance with another aspect of the present invention, there is provided a method for controlling a semiconductor memory device according to the MRS, including the steps of: decoding addresses inputted to the MRS; determining whether or not the addresses inputted to the MRS are defined; and activating a corresponding configuration signal if the addresses are defined or holding a previous configuration signal if the addresses are not defined.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a mode register set (MRS) configuration circuit for use in a semiconductor memory device in accordance with the present invention will be described in detail referring to the accompanying drawings.

Figure 5:
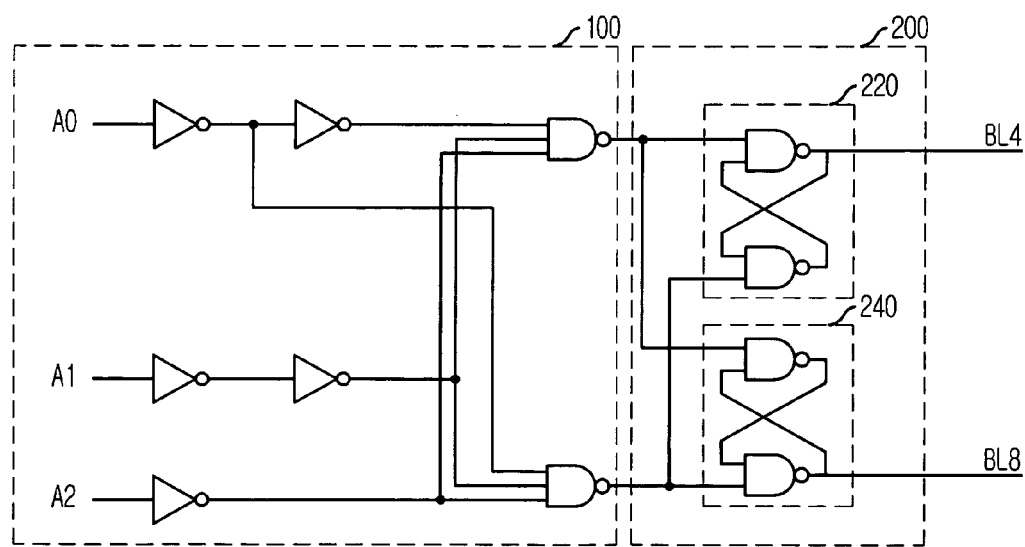
FIG. 5 is a schematic circuit diagram showing an MRS configuration circuit in accordance with a first preferred embodiment of the present invention.

FIG. 5 is a schematic circuit diagram showing an MRS configuration circuit in accordance with a first preferred embodiment of the present invention.

The MRS configuration circuit receives and decodes a first to a third address signals A0 to A2 for generating a first and a second burst length set-up signals BL4 and BL8. A burst length (BL) of a semiconductor memory device is determined based on the first and the second burst length set-up signals BL4 and BL8. That is, if the first burst length set-up signal BL4 is activated as a logic high level, the BL is set to 4, or, if the second burst length set-up signal BL8 is activated as a logic high level, the BL is set to 8.

As shown, the MRS configuration circuit includes a decoding unit 100 and an output unit 200.

The decoding unit 100 decodes the first to the third address signals A0 to A2 and outputs a plurality of decoded signals to the output unit 200. The output unit 200 receives the plurality of decoded signals in order to activate one of the first and the second burst length set-up signals BL4 and BL8 when one of output signals of the decoding unit 100 is activated. If more than one of the output signals of the decoding unit 100 are activated, the output unit 200 holds a previous state of output signals of the output unit 200.

The output unit 200 includes a first RS-type latch 220 and a second RS-type latch 240. The first RS-type latch 220 receives one of the output signals of the decoding unit 100 as a set signal and receives the other signal as a reset signal. In this case, the set signal and the reset signal of the first RS-type latch 220 are respectively a reset signal and a set signal of the second RS-type latch 240. Herein, each of the first and the second RS-type latches 220 and 240 is cross-coupled NAND gates.

Figure 1:
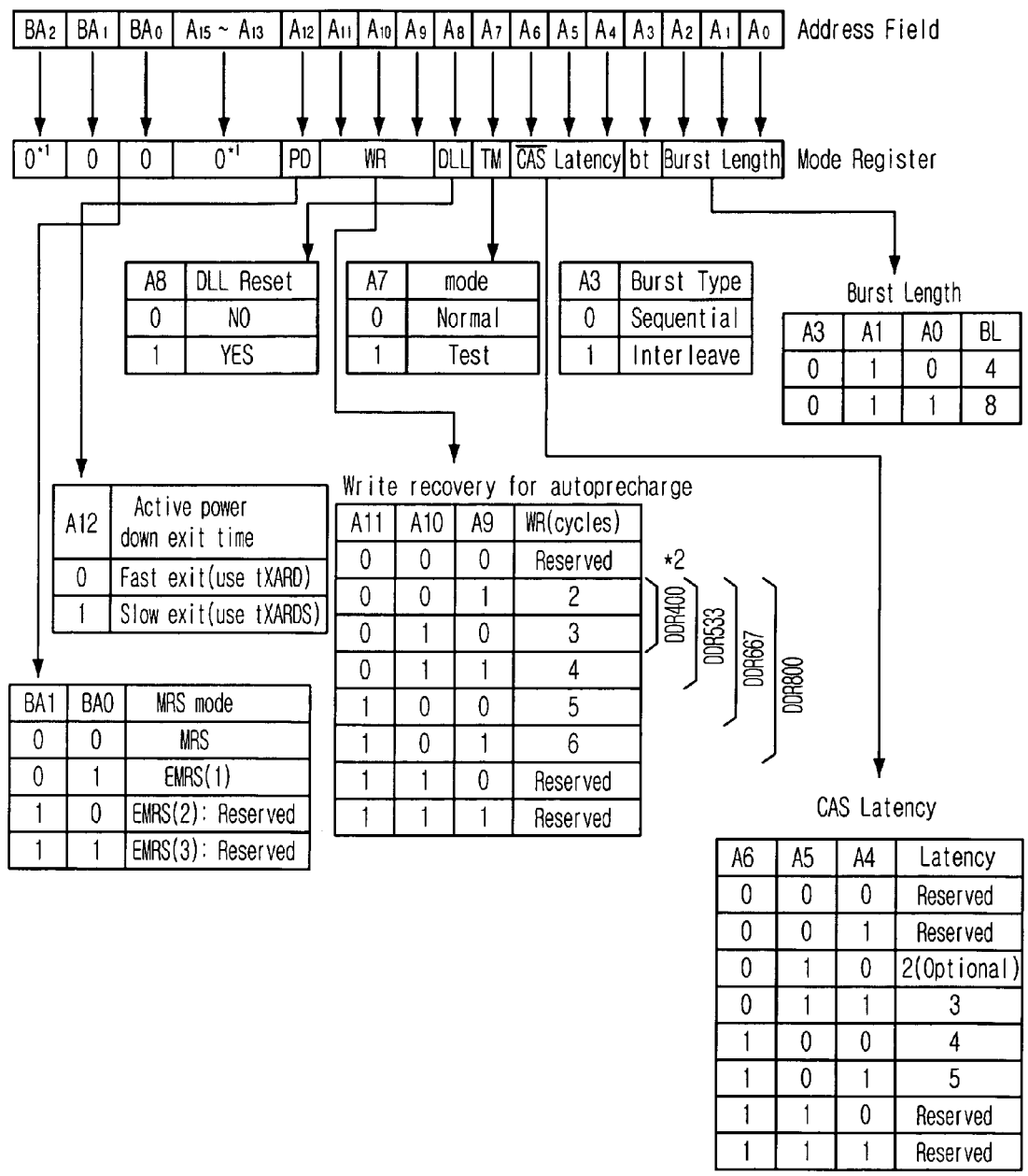
FIG. 1 is a diagram showing a mode register set (MRS) according to DDR SDRAM specification.
Figure 2:
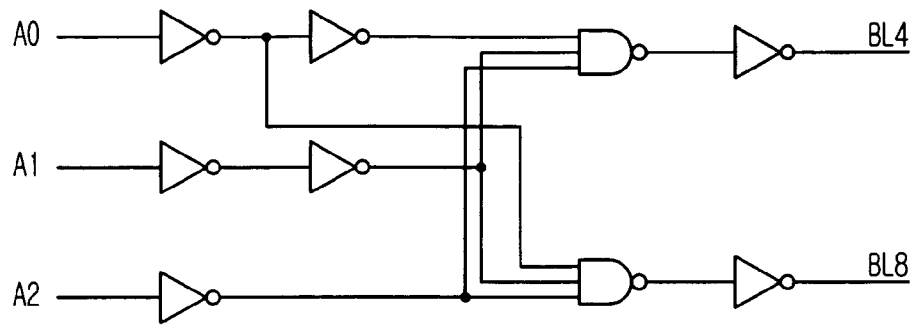
FIG. 2 is a schematic circuit diagram showing a first conventional MRS configuration circuit.
Figure 3:
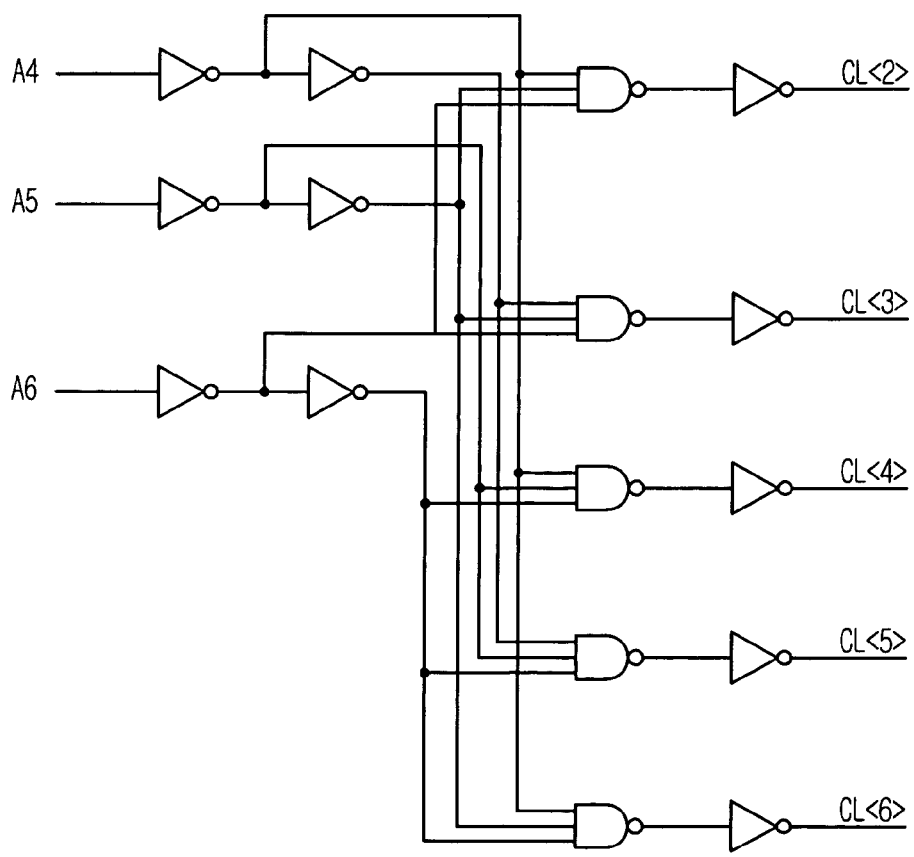
FIG. 3 is a schematic circuit diagram showing a second conventional MRS configuration circuit.
Figure 4:
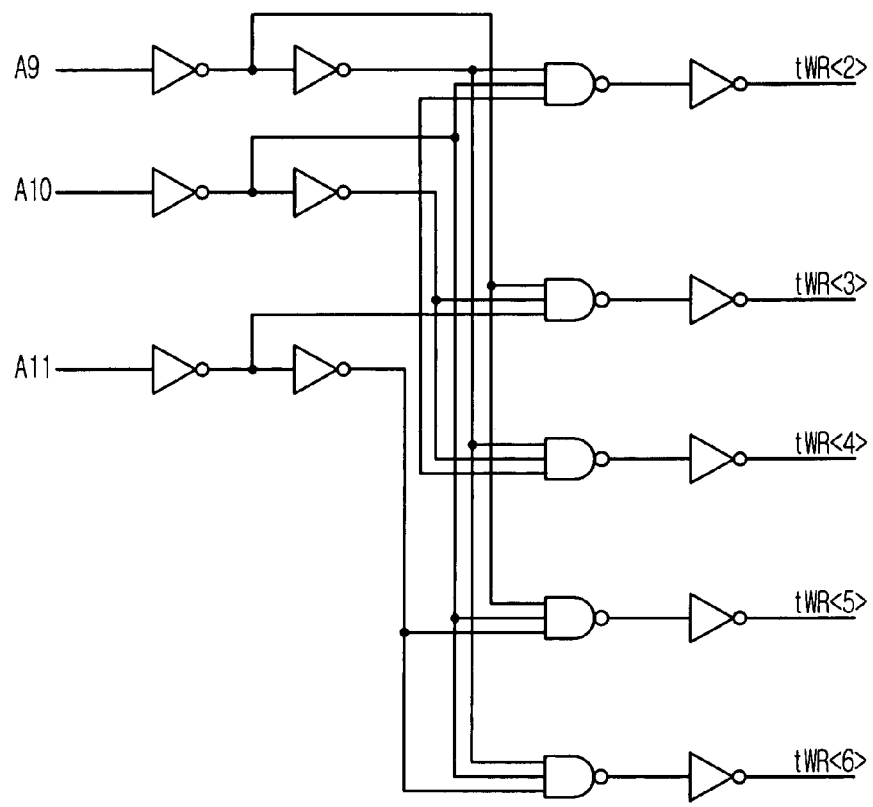
FIG. 4 is a schematic circuit diagram showing a third conventional MRS configuration circuit.

Meanwhile, in comparison with the first conventional MRS configuration circuit shown in FIG. 2, the decoding unit 100 does not includes inverters at output nodes of the decoding unit 100. That is, outputs of the decoding unit 100 are inverted signals of the first conventional MRS configuration circuit.

Therefore, if one of the first and the second RS-type latches 220 and 240 receives an activated output signal of the decoding unit 100 as the set signal, an output signal of the one of the RS-type latches 220 and 240 is activated. The other RS-type latch, having the activated output signal as the reset signal, inactivates its output signal. If all the output signals of the decoding unit 100 are activated, the first and the second RS-type latches 220 and 240 keep their previous output states.

Therefore, if a reserved code is inputted to the decoding unit 100, all the output signals of the decoding unit 100 are activated, and the first and the second RS-type latches 220 and 240 keep their previous output states.

Therefore, the MRS configuration circuit in accordance with the present invention can keep its previous output signal when the reserved code is inputted. Therefore, even if the reserved code is accidentally inputted, a semiconductor memory device can stably operate.

Figure 6:
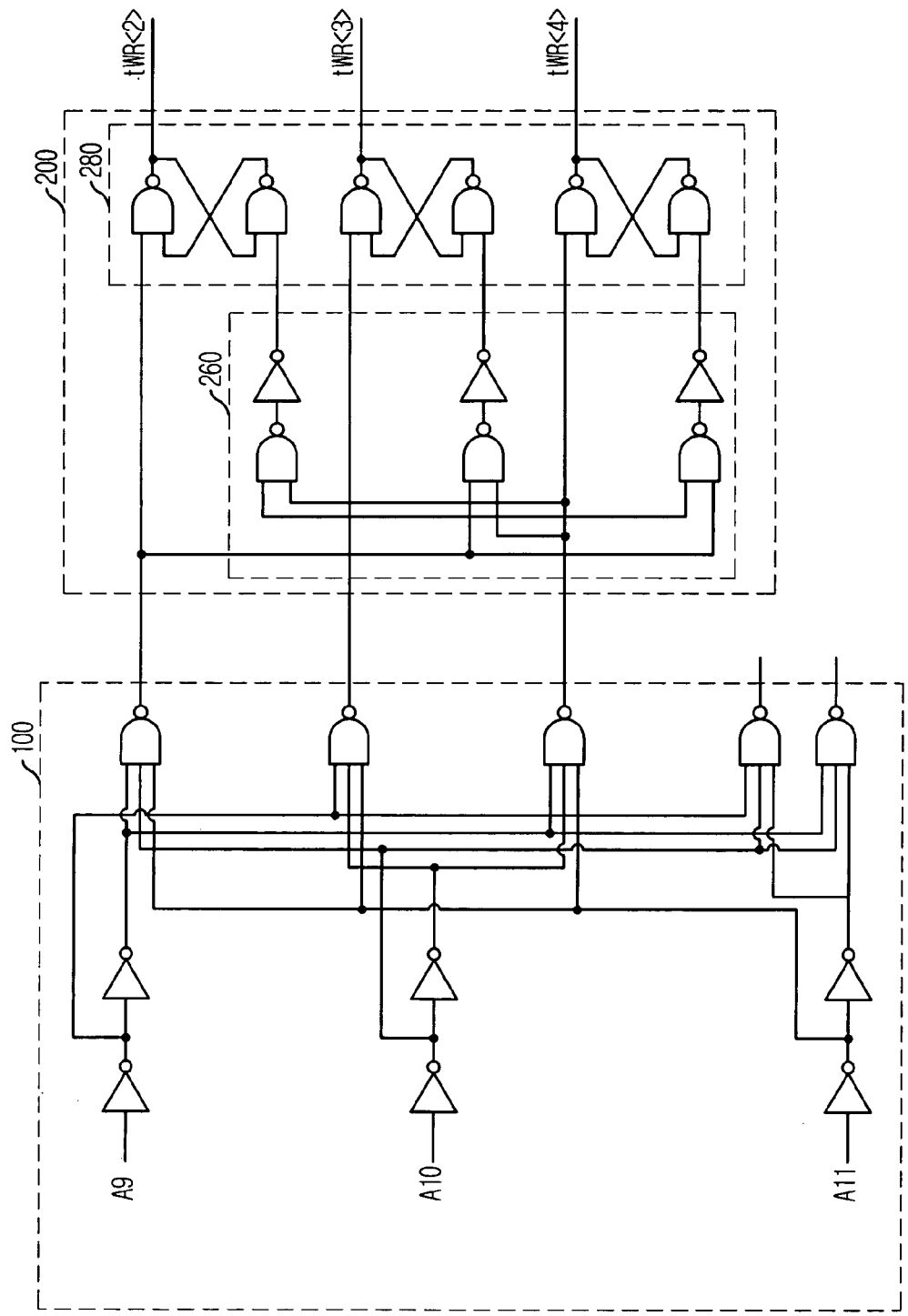
FIG. 6 is a schematic circuit diagram showing an MRS configuration circuit in accordance with a second preferred embodiment of the present invention.

FIG. 6 is a schematic circuit diagram showing an MRS configuration circuit in accordance with a second preferred embodiment of the present invention.

Similarly to the MRS configuration circuit shown in FIG. 5, the MRS configuration circuit shown in FIG. 6 includes a decoding unit 100 and an output unit 200. The output unit 200 includes an RS-type latch unit 280 and reset signal generator 260. Since a plurality of reset signals are required for the RS-type latch unit 280, the reset signal generator 260 is included.

The decoding unit 100 decodes a tenth to a twelfth address signals A9 to A11 and outputs a plurality of decoded signals to the output unit 200. The output unit 200 receives the plurality of decoded signals in order to activate one of a first to a third write latency signals tWR<2> to tWR<4> when one of output signals of the decoding unit 100 is activated.

If a reserved code is inputted to the decoding unit 100, the output unit 200 keeps its previous output state.

Therefore, in accordance with the present invention, a semiconductor memory device can be stably operated even if a reserved code is inputted to the MRS due to a noise or a glitch, and, thus, a stability of the semiconductor memory device can be increased.

The present application contains subject matter related to Korean patent application No. 2004-49875, filed in the Korean Patent Office on Jun. 30, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having a mode register set (MRS), comprising:
    a decoding unit for decoding a plurality of address signals included in the MRS and outputting a plurality of decoded signals; and
    an output unit for outputting a plurality of configuration signals and activating one of the plurality of configuration signals in response to the plurality of decoded signals, wherein the output unit keeps its previous output signals if more than one of the plurality of decoded signals are activated.

2. The semiconductor memory device as recited in claim 1, wherein when the plurality of address signals are inputted as a reserved code of the MRS, more than one of the plurality of decoded signals are activated.

3. The semiconductor memory device as recited in claim 2, wherein when one of the plurality of decoded signals is activated, a corresponding configuration signal is activated.

4. The semiconductor memory device as recited in claim 3, wherein the output unit includes a plurality of RS-type latches each of which for receiving each of the plurality of decoded signals as reset signals and set signals.

5. The semiconductor memory device as recited in claim 4, wherein each of the plurality of RS-type latches is cross coupled NAND gates.

6. The semiconductor memory device as recited in claim 5, wherein the decoding unit includes:
 a first inverter and a second inverter connected in series for receiving a first address signal;
 a third inverter and a fourth inverter connected in series for receiving a second address signal;
 a fifth inverter for receiving a third address signal;
 a first NAND gate for receiving an output of the second inverter, and output of the fourth inverter and an output of the fifth inverter to output a first decoded signal; and
 a second NAND gate for receiving an output of the first inverter, the output of the fourth inverter and the output of the fifth inverter to output a second decoded signal.

7. The semiconductor memory device as recited in claim 6, wherein each RS-type latch includes:
 a third NAND gate for receiving the first decoded signal and the second decoded signal to output a first configuration signal; and
 a fourth NAND gate for receiving the first decoded signal and the second decoded signal to output a second configuration signal, wherein an output of the third NAND gate is inputted to the fourth NAND gate and an output of the fourth NAND gate is inputted to the third NAND gate.

8. A method for controlling a semiconductor memory device according to a mode register set (MRS), comprising the steps of:
 a) decoding addresses inputted to the MRS;
 b) determining whether or not the addresses inputted to the MRS are defined; and
 c) activating a corresponding configuration signal if the addresses are defined or holding a previous configuration signal if the addresses are not defined.

* * * * *